United States Patent [19]

Robinson et al.

[11] Patent Number: 4,616,332

[45] Date of Patent: Oct. 7, 1986

[54] APPARATUS FOR CONVERTING ANALOG-FORMAT SIGNALS TO PULSE-FORMAT SIGNALS

[75] Inventors: Robert J. Robinson, Mansfield, Mass.; David A. Richardson, East Greenwich, R.I.

[73] Assignee: The Foxboro Company, Foxboro, Mass.

[21] Appl. No.: 423,256

[22] Filed: Sep. 24, 1982

[51] Int. Cl.$^4$ .................. H03M 5/08; G06G 7/20
[52] U.S. Cl. ............... 364/814; 340/347 AD; 340/347 M; 307/260; 329/126
[58] Field of Search ............ 340/347 NT; 328/127, 328/128, 161; 307/271, 260, 261, 265; 364/829, 814; 329/126

[56] References Cited

U.S. PATENT DOCUMENTS

| | | | |
|---|---|---|---|
| Re. 28,833 | 5/1976 | Dorey | 340/347 NT |
| 3,712,977 | 1/1973 | Rice, Jr. | 364/814 |
| 3,714,470 | 1/1973 | Goldberg | 307/261 |
| 3,737,640 | 6/1973 | Pao et al. | 364/849 |
| 3,842,371 | 10/1974 | Kelly | 331/143 |
| 3,898,447 | 8/1975 | Bozarth, Jr. | 364/814 |
| 3,942,172 | 3/1976 | Tucker | 340/347 NT |
| 4,063,236 | 12/1977 | Amemiya et al. | 340/347 NT |
| 4,109,168 | 8/1978 | Raymond | 328/127 |
| 4,243,975 | 1/1981 | Masuda et al. | 340/347 NT |

FOREIGN PATENT DOCUMENTS 0030824  6/1981  European Pat. Off. ............ 364/829

*Primary Examiner*—Felix D. Gruber
*Assistant Examiner*—Thomas G. Black
*Attorney, Agent, or Firm*—Parmelee, Bollinger & Bramblett

[57] ABSTRACT

Apparatus for converting an analog-format electrical signal or quantity (such as the magnitude of an electrical circuit element) into a corresponding pulse-format signal, preferably in the form of a train of periodic pulses the lengths of which are controllable as a percentage of the cyclic period. A pulsed duty-cycle signal is developed in a negative feedback loop around an integrator having an analog-format input signal. The integrator output controls the d-c level of an up-and-down ramp signal which is fed to a comparator to produce pulses during the times the ramp voltage is above (or below) the firing threshold of the comparator. These pulses control a switch between the integrator input and a reference voltage so as to produce a negative feedback signal for the integrator. The negative feedback action controls the d-c level at the integrator ouptut and thereby sets the pulse duty-cycle to a value such that the average signal level through the pulsed switch to the integrator input relates in prescribed fashion to the applied input signal. The duty-cycle signal developed through such feedback action corresponds directly to the magnitude of the applied input signal.

39 Claims, 7 Drawing Figures

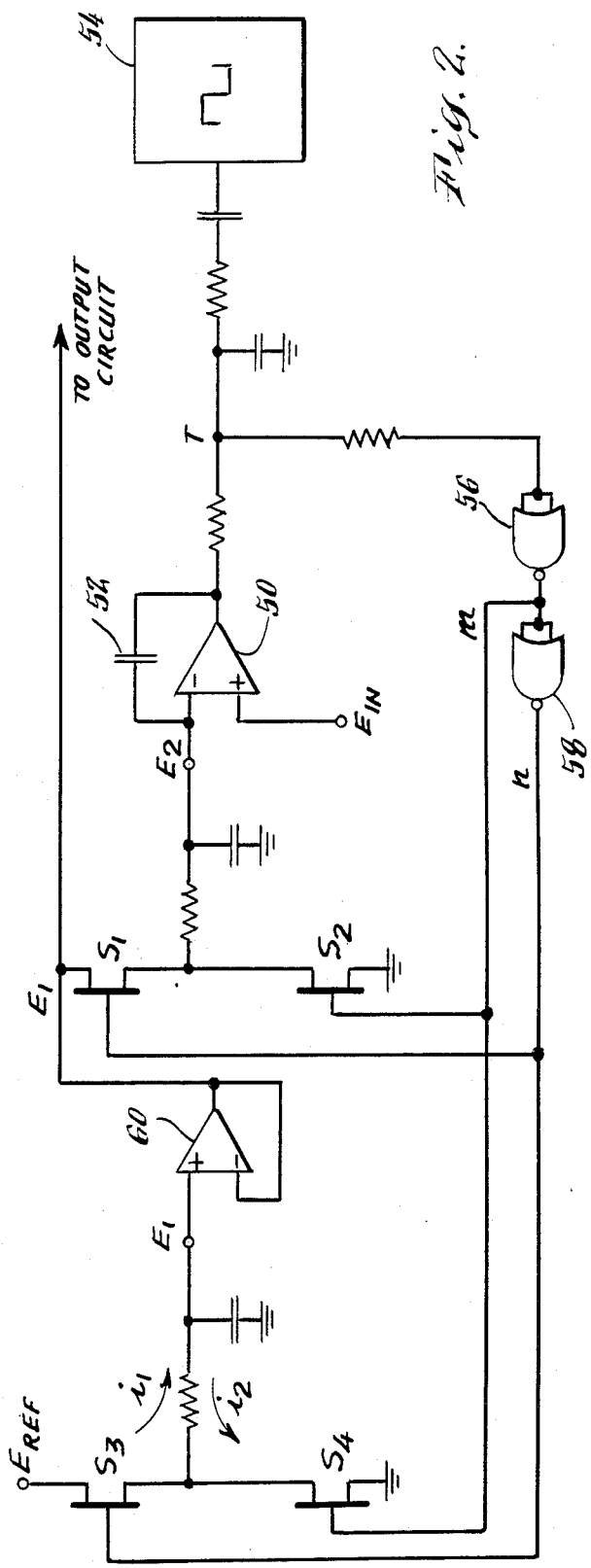

APPARATUS FOR CONVERTING ANALOG-FORMAT SIGNALS TO PULSE-FORMAT SIGNALS

BACKGROUND OF THE INVENTION

1. Field of the Invention

This invention relates to electrical signal conversion circuits. More particularly, this invention relates to circuits for converting analog-format signals, e.g. representing an electrical quantity, a ratio, or the like, into a corresponding pulse-format signal such as a variable duty-cycle signal. Such circuits are especially useful in instrumentation apparatus of the type employed for measuring and controlling process conditions such as flow rate, temperature and so on.

2. Description of the Prior Art

Apparatus used in measuring and control instrumentation frequently is required to process electrical signals which appear in analog format, for example, voltage or current signals representing selected process conditions or quantities such as a ratio between two process variables. Difficulties may for various reasons arise in attempting to process such signals in their original analog format. Thus it has been useful in many cases to convert the signals to another format to carry out required processing and/or translations. Commonly, analog-format signals are converted to multiple-bit digital signals for processing or other handling, particularly if any processing to be carried out is relatively complex so that it can economically be performed by readily available high-speed digital computers. In many cases, however, use of computer techniques is unwarranted because it is too costly for the problem being addressed, and for those situations a simpler and less expensive solution to the problem must be sought.

SUMMARY OF THE INVENTION

In preferred embodiments of the present invention, to be described hereinbelow in detail, relatively simple and economical apparatus is provided for converting an analog-format electrical signal or quantity (such as the magnitude of an electrical circuit element) into a corresponding pulse-format duty-cycle or frequency signal. Such pulse-format signal desirably is in the form of a train of periodic pulses the lengths of which are controllable, e.g. as a percentage of the cyclic period. The binary nature of the signal permits it to be handled and/or processed using conventional techniques available in digital technology, and the simplicity of the conversion apparatus effects substantial cost savings. Apparatus employing the invention provides highly accurate results with minimal need for expensive calibrated elements in the conversion circuitry. Such apparatus also is advantageous in having small power requirements, thus permitting complex functions to be performed with the relatively low power levels available in field transmitters and the like.

In accordance with an important aspect of preferred embodiments of the invention, a pulsed duty-cycle signal is developed in a negative feedback loop around an integrator to the input of which is applied an analog-format signal. The integrator output controls the d-c level of an up-and-down ramp signal which is fed to a comparator to produce pulses during the times the ramp voltage is above (or below) the firing threshold of the comparator. These pulses control a switch between the integrator input and a reference voltage so as to produce a negative feedback signal for the integrator. The negative feedback action controls the d-c level at the integrator output and thereby sets the pulse duty-cycle to a value such that the average signal level through the pulsed switch to the integrator input relates in prescribed fashion to the applied input signal. The duty-cycle signal developed through such feedback action corresponds directly to the magnitude of the applied input signal.

Other objects, aspects and advantages of the invention will in part be pointed out in, and in part apparent from, the following detailed description of preferred embodiments of the invention, considered together with the accompanying drawings.

BRIEF DESCRIPTION OF THE DRAWINGS

FIG. 1 is a circuit diagram, somewhat simplified, of an arrangement for developing a duty-cycle signal corresponding to a voltage representing a ratio set-point signal, and for converting that duty-cycle signal to a corresponding control signal;

FIG. 2 is a circuit diagram of a device for extracting square root, employing cascaded duty-cycle signals developed in accordance with this invention;

DESCRIPTION OF PREFERRED EMBODIMENTS

Figure 3:
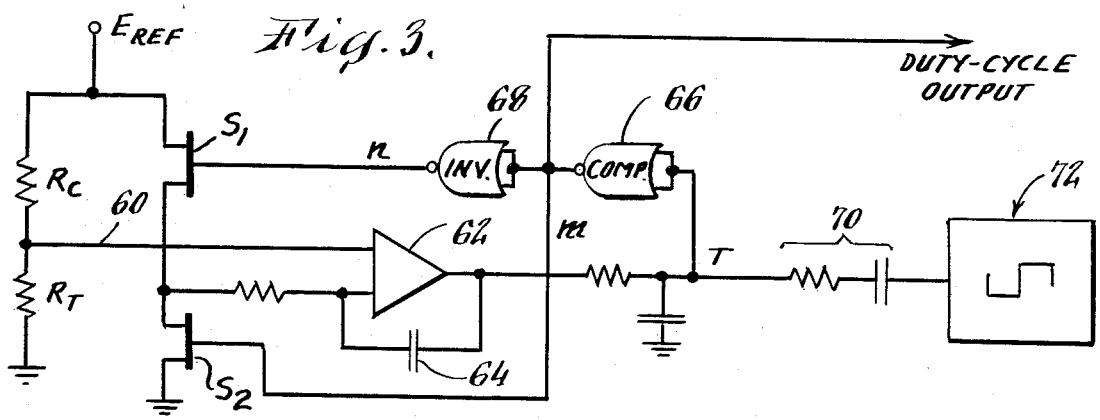
FIG. 3 is a circuit diagram of apparatus for converting the value of a temperature-sensitive resistor to a pulsed duty-cycle signal.

Referring now to FIG. 1, there is shown apparatus comprising a signal-translating circuit 10 in the form of an integrator to the input of which a ratio set-point signal $E_{in}$ is applied. The integrator is conventional, incorporating an amplifier 12 with a feedback capacitor 14. The output of the amplifier is directed through an RC circuit 16 and controls the d-c level of a circuit point T in accordance with the net input to the integrator. The circuit point T also is supplied with a triangular-wave signal comprising a series of up-and-down ramps as illustrated graphically at 18.

Illustratively, the ramp signal 18 is produced from a square-wave signal which is coupled through a series RC circuit 20 to the circuit point T. The square-wave signal can be developed by any conventional square-wave generator 22. The squarewave signal is shown graphically at 24 above the ramp signal 18, to indicate the time relationships involved.

The ramp signal 18 at circuit point T is directed to a comparator 26 which produces a series of output pulses the lengths of which are determined by when the ramp signal crosses the comparator firing threshold (as indicated in the graphic presentation of the ramp signal 18). The letter "m" has been used in the drawing to designate the times when the ramp signal is below the firing threshold; during such times, the comparator 26 produces a positive pulse signal (such output signal also being labelled "m" in FIG. 1). The output "m" of the comparator is directed to an inverter 28 which produces positive pulses during the times "n" when the ramp signal 18 is above the comparator firing threshold. The outputs of both the comparator and the inverter define a duty-cycle signal in the form of a train of periodic pulses the lengths of which are a controllable percentage of the cyclic period.

The duty-cycle signals developed by the comparator 26 and the inverter 28 are directed to the control electrodes of respective switches $S_1$ and $S_2$ forming part of a circuit for converting the duty-cycle into a corresponding analog-format negative feedback signal $E_{fb}$ having an average value responsive to the percentage duty cycle. The duty-cycle pulses ("n" and "m") cause the switches $S_1$ and $S_2$ to open and close alternately; that is, when one switch is closed, the other is open, and vice versa.

The timing of the $S_1$ and $S_2$ switch closures and the magnitude of a reference voltage $E_{ref}$ control the negative feedback signal $E_{fb}$ which is applied to the input of the integrator 10 in opposition to the input signal $E_{in}$. The upper switch $S_1$ is connected to the reference voltage $E_{ref}$ so that when that switch is closed, a current $i_1$ flows through an RC circuit 30 to the input of the integrator 10. During the next part of the cycle, when $S_1$ is open and $S_2$ is closed, a current $i_2$ flows back from the RC circuit 30 to ground, in accordance with the magnitude of the feedback voltage $E_{fb}$ at the integrator input. The d-c level at circuit point T is controlled by the output of the integrator 10 which responds to the difference between the two input signals $E_{in}$ and $E_{fb}$. If, for example, $E_{fb}$ is smaller than $E_{in}$, circuit point T will be made more positive, so that "n" will increase. This will turn $S_1$ on more of the time, and $S_2$ on less of the time, until $E_{fb}$ is increased to a level matching $E_{in}$.

Defining "n" as the "on" duty-cycle of switch $S_1$ and "m" as the "on" duty-cycle of switch $S_2$, the following relationships will prevail:

$$\bar{i}_1 \text{ (average current)} = (n)\frac{E_{ref} - E_{fb}}{R}$$

$$\bar{i}_2 \text{ (average current)} = (m)\frac{E_{fb}}{R} = (1 - n)\frac{E_{fb}}{R}$$

Since $\bar{i}HD\ 1 = \bar{i}HD\ 2$, then
$n(E_{ref} - E_{fb}) = (1-n)E_{fb}$
thus
$E_{fb} = nE_{ref}$ Since $E_{fb} = E_{in}$, then $$n = \frac{E_{in}}{E_{ref}}$$

Thus, the duty-cycle represented by "n" is directly proportional to the applied input signal $E_{in}$, since $E_{ref}$ is invariant.

In the embodiment of FIG. 1, the pulsed duty-cycle signals "n" and "m" corresponding to $E_{in}$ are used to control a second switched circuit basically similar to the one described above. This second circuit includes switches $S_3$ and $S_4$ controlled by pulse signals "n" and "m" so as to develop currents $i_3$ and $i_4$. The upper switch $S_3$ is coupled to a voltage $E_3$ which represents a variable to be ratioed; the lower switch $S_4$ is returned to ground. The switch currents $i_3$ and $i_4$ pass through an RC circuit 32 to produce a net voltage $E_4$ at the input to a buffer amplifier 34 which produces the same voltage $E_4$ at its output. Using the same reasoning as outlined above, it will be seen that $E_4/E_3 = n$, the "on" duty cycle of both switches $S_1$ and $S_3$. Thus, $E_4/E_3 = E_{in}/E_{ref}$. Accordingly, the ratio $E_4/E_3$ is made to be directly proportional to $E_{in}$, which is the overall functional object of the apparatus of FIG. 1.

In a commercially practicable design, the comparator 26 preferably is of the CMOS type, e.g. such as those available as quad amplifiers from various suppliers under the type number 4001. CMOS devices are preferred because they require very little power. The exact firing threshold of such a device is not a calibrated value. In some devices, firing may occur anywhere between 30–70% of supply voltage, so that the actual firing point may vary from unit to unit. However, the firing point is quite repeatable over the short term, and that is all that is needed to provide the high accuracy of which the above described circuit is capable.

The switches $S_1$–$S_4$ also preferably are of CMOS type. The amplifier 12 may be of any conventional design, advantageously providing relatively high gain with stable operation. It may be noted that the accuracy of the FIG. 1 circuit is not dependent upon having a calibrated element within the negative feedback loop where the duty-cycle signal is developed. This is because the feedback action always brings the duty-cycle signal to the value which produces an averaged feedback signal $E_{fb}$ matching the input signal $E_{in}$.

FIG. 2 shows apparatus for electronically extracting the square root of a magnitude represented by an analog-format signal. For example, such apparatus could be used with known differential-pressure (D.P.) flow transmitters which produce a flow signal proportional to the square of the flow rate. By extracting the square-root of the flow signal, the final output signal will be linear with respect to flow.

The flow signal from such a differential-pressure transmitter is identified in FIG. 2 as $E_{in}$, and is connected to the positive terminal of an op amp 50 having a feedback capacitor 52 to perform integration. The circuit point T in the output of the amplifier 50 is (as in FIG. 1) supplied with an up-and-down ramp signal developed from the output pulses of a square-wave generator 54. The d-c level of this ramp signal is controlled by the amplifier output.

Also as before, the ramp signal from circuit point T is coupled to a comparator 56 driving an inverter 58 to produce duty-cycle signals "m" and "n". These signals activate respective switches $S_1$, $S_2$ to control the average magnitude of a negative feedback signal for the op amp 50. The voltage producing this feedback signal is identified as $E_1$ and serves as the output signal of the square-rooting device.

The voltage $E_1$ is developed by a buffer amplifier 60 having at its input an averaged signal derived from a second duty-cycle switch circuit $S_3$, $S_4$, similar to $S_1$, $S_2$. This second switch circuit is energized by a reference voltage $E_{ref}$, and the switches are activated by the duty-cycle signals m and n.

Following the same type of mathematical analysis given above with respect to FIG. 1, the following relations can be developed for FIG. 2:

n = "on" duty cycle of $S_1$, $S_3$
m = "on" duty cycle of $S_2$, $S_4$ $$\bar{i}_1 = n \cdot \frac{E_{ref} - E_1}{R_1}$$

$$\bar{i}_2 = m \cdot \frac{E_1}{R_1}$$

$$\bar{i}_1 = \bar{i}_2$$

$$nE_{ref} - nE_1 = mE_1$$

$$E_{ref} = (1 + m/n)E_2$$

$$E_1 = (1 + m/n)E_1$$

Since $E_2 = E_{in}$ then $$E_{ref} = (1 + m/n)E_1 = (1 + m/n)^2 E_{in}$$

$$1 + m/n = \sqrt{E_{ref}/E_{in}}$$

Thus $$E_1 = \frac{E_{ref}}{1 + m/n} = E_{ref}\sqrt{\frac{E_{in}}{E_{ref}}} = \sqrt{E_{in}} \cdot \sqrt{E_{ref}}$$

Accordingly, the output signal $E_1$ is proportional to the squareroot of $E_{in}$ multiplied by a constant, since $E_{ref}$ is fixed in magnitude.

FIG. 3 shows an arrangement for developing a pulsed duty-cycle signal corresponding to the value of a variable resistor, e.g. a temperature-sensitive resistor $R_T$ forming part of a known type of temperature transmitter. The resistor $R_T$ is connected in series with a calibrating resistor $R_C$, and both are energized by a reference voltage $E_{ref}$ so as to produce a temperature signal on an output line 60. This signal is connected to one input of an op amp 62 having an integrating capacitor 64. The other amplifier input receives a feedback signal developed (in a manner described above) by a pair of series-connected switches $S_1$, $S_2$ driven alternately by pulse signals derived from a comparator 66 and an inverter 68 coupled to the output of the amplifier 62.

As in the FIG. 1 embodiment, the output circuit of the amplifier 62 receives a triangular-wave ramp signal from an RC circuit 70 coupled to a square-wave generator 72. As explained above, the comparator 66 produces a pulsed signal having a duty cycle determined by the d-c level of the amplifier output circuit relative to the comparator firing threshold. The duty-cycle of the signal pulses ("m" and "n") controls a feedback signal developed by the switches $S_1$, $S_2$ which are energized by $E_{ref}$.

The feedback action forces the duty-cycle signal to correspond to the amplifier input signal from the resistor network $R_T$, $R_C$. This input signal in turn represents the temperature of the resistor $R_T$. Since $E_{ref}$ energizes both the resistor network and the switches $S_1$, $S_2$, any changes in the value of $E_{ref}$ affects both the input signal and the feedback signal equally. Thus such changes in $E_{ref}$ will not affect the duty-cycle output signal.

Although the embodiments of FIGS. 1-3 described above all use a pair of switches $S_1$, $S_2$ to develop a feedback signal, it is possible in certain applications to employ a feedback circuit having only a single switch.

Figure 4:
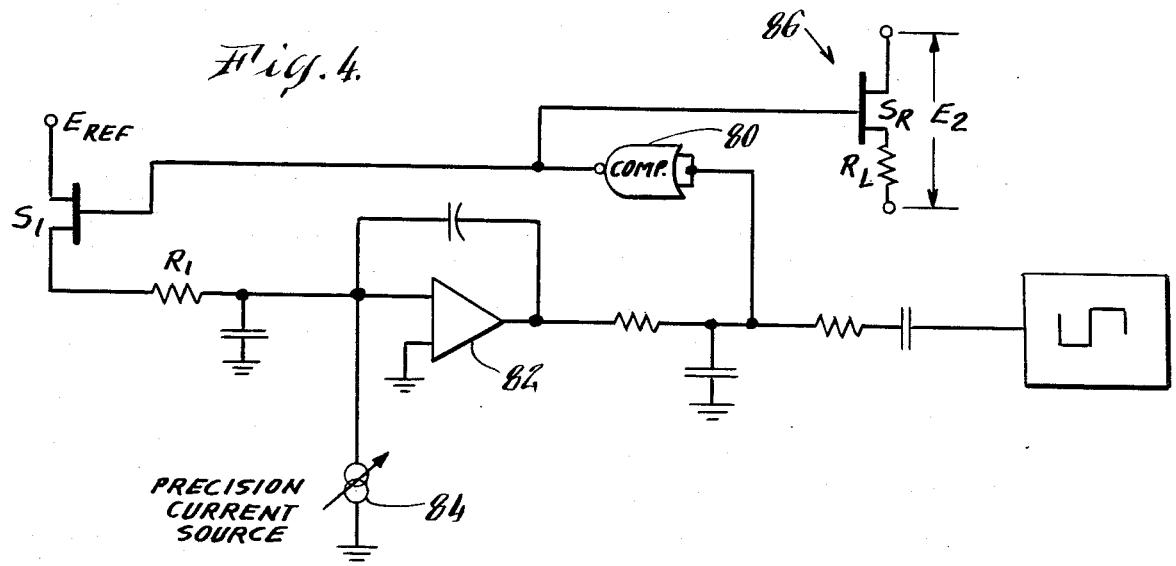
FIG. 4 is a circuit diagram showing a modified arrangement employing a single switch in the input circuit of the integrator.

Referring now to FIG. 4, the circuit includes a single switch $S_1$ which is driven by a comparator 80 controlled in the same manner as the comparator in FIG. 1. When the switch turns on, current flows from the reference voltage source $E_{ref}$ through a resistor $R_1$ to a summing junction of the op amp 82. The summing junction also receives current from a precision current source 84, shown to be variable to indicate that it provides the input signal for the device. The feedback action of the circuitry including the switch $S_1$ produces a current balance at the amplifier input, so that the duty-cycle signal from the comparator 80 will correspond to the input current.

The duty-cycle signal from the comparator 80 may be directed to a receiving circuit such as that generally indicated at 86 and comprising a second switch $S_R$ like $S_1$. The switch $S_R$ is connected to a load resistor $R_L$, and the resulting series circuit is energized by a voltage $E_2$. The receiver switch $S_R$ opens and closes in synchronism with switch $S_1$, and changes in the average current through the load resistor $R_L$ will track changes in the average current through the resistor $R_1$. Looked at from another perspective, changes in the apparent resistance of $R_1$, due to changes in duty-cycle of the pulsed feedback signal, will be matched by corresponding changes in the apparent resistance of $R_L$. Such resistance tracking is a characteristic of important utility in certain instrument designs.

Alternative input circuits for the amplifier 82 may if desired include the addition of a shunt resistor $R_S$ (not shown). With that arrangement, the calibration factor of the device will be related to $R_1$ and $R_S$, rather than the absolute resistance value of $R_1$.

Circuitry in accordance with the present invention provides important advantages for use with DC magnetic flowmeters. Such flowmeters produce a d-c flow signal proportional to the fluid flow rate and to the magnetic flux density in the flow conduit. The flux is proportional to the field current, so that any change in this current will produce a corresponding change in the flow signal. The present invention can be employed to produce an output pulse signal which is automatically compensated for changes in field current.

Figure 5:
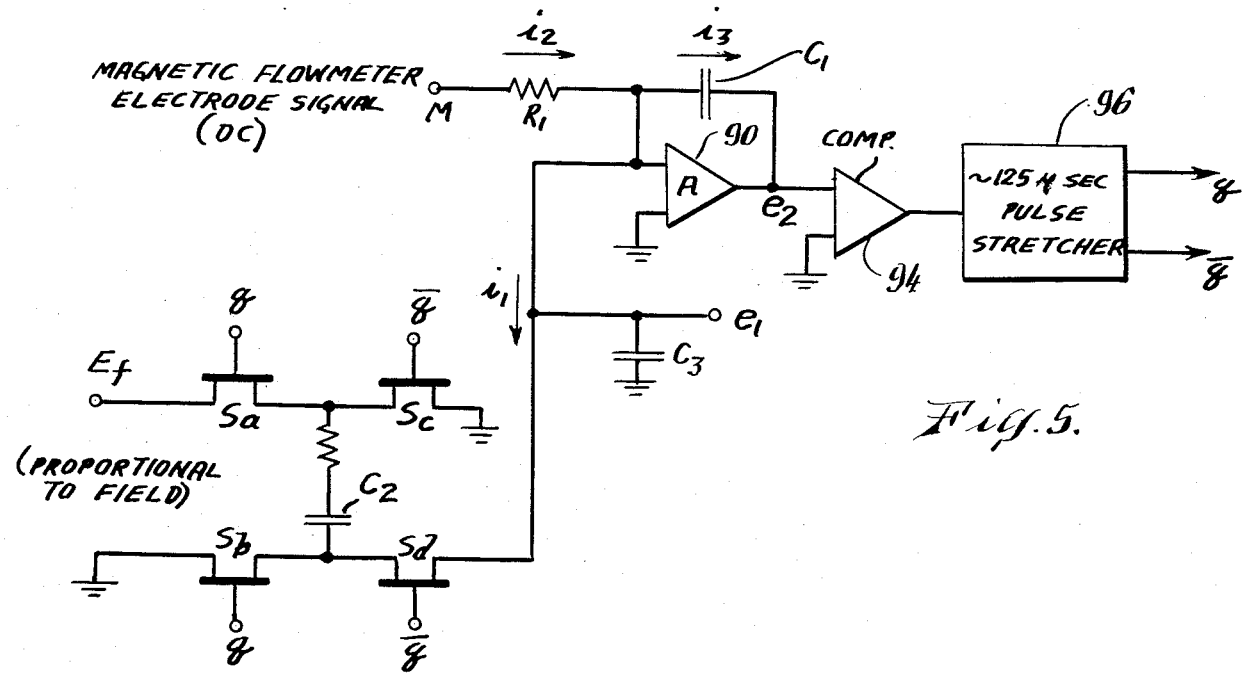
FIG. 5 is a block diagram showing apparatus for developing a pulsed frequency signal representing the output of a DC magnetic flow meter.

Referring now to FIG. 5, the flow signal M from a DC magnetic flowmeter is coupled through a resistor $R_1$ to one input terminal of an op amp 90 having an integrating capacitor $C_1$. The amplifier output is coupled to a comparator 94 which drives a conventional pulse-stretching circuit 96. When the comparator input falls below its firing threshold, the pulse-stretching circuit is activated to produce a logic low pulse "q" having a fixed length, e.g. 125 μsec. At the end of this period, the pulse q goes high until the comparator fires again.

While the pulse q is high, it closes a pair of switches $S_a$, $S_b$ to connect a relatively small capacitor $C_2$ to a source of voltage $E_f$ having a magnitude proportional to the field current of the magnetic flowmeter. During this period, the capacitor $C_1$ charges up to the voltage $E_f$. When the pulse q subsequently goes low to open switches $S_a$, $S_b$, the complementary pulse $\bar{q}$ goes high to close a pair of switches $S_c$, $S_d$ to connect the capacitor $C_1$ to the amplifier input.

Figure 6:
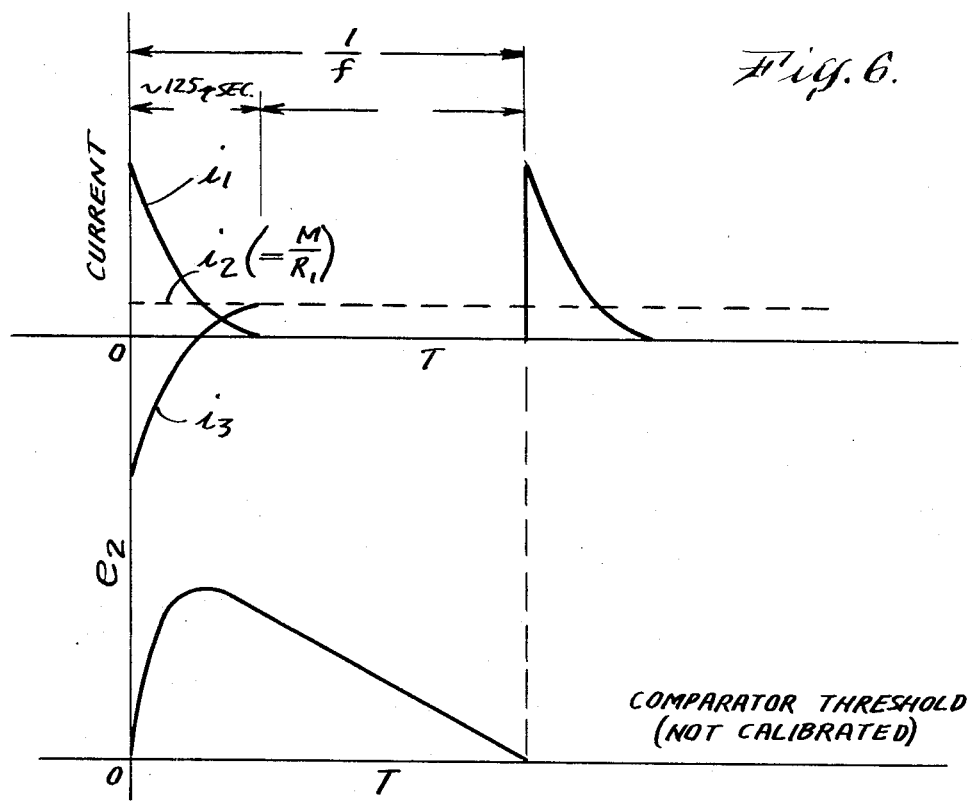
FIG. 6 presents correlated graphs showing the variation of certain signal levels with time.

This connection places the negative terminal of the capacitor $C_2$ at the amplifier input, and produces a flow of current $i_1$ from the summing mode (see FIG. 6), drawing current from the integrator capacitor $C_1$, and driving up the amplifier output voltage e₂. The amplifier input voltage e₁ does not change significantly, due to the presence of a relatively large capacitor $C_3$. As seen in FIG. 6, by the end of the 125 μsec pulse, the current $i_1$ has returned to zero, and the current $i_3$ into the integrating capacitor $C_1$ again equals the input current $i_2$ (which in turn is equal to $M/R_1$).

When the current $i_3$ into the integrating capacitor $C_1$ passes through zero, the amplifier output $e_2$ will peak and begin to drop. As shown in FIG. 6, the voltage fall-off becomes a ramp signal, returning towards zero. The time required to reach zero is determined by (1) the amount of charge which had been previously stored on the small capacitor $C_2$ (the charge being proportional to the voltage $E_f$ and thus proportional to the field current of the magnetic flowmeter) and by (2) the magnitude of $i_2$ (which is proportional to the flowmeter output signal M).

It will be seen that the output of the circuit is a periodic pulse signal (q or q̄) having a period comprising a first fixed-duration portion (e.g. 12 μsec) and a second portion (the time for $e_2$ to drop to zero) having a variable duration determined by both the fluid flow rate and the field current. The frequency "f" of the output signal will be the inverse of this cyclic period. It can readily be shown that the frequency "f" is proportional to $M/E_f$. Since the flowmeter field current is a factor in both M and $E_f$, the frequency output signal will automatically be compensated for changes in field current.

Figure 7:
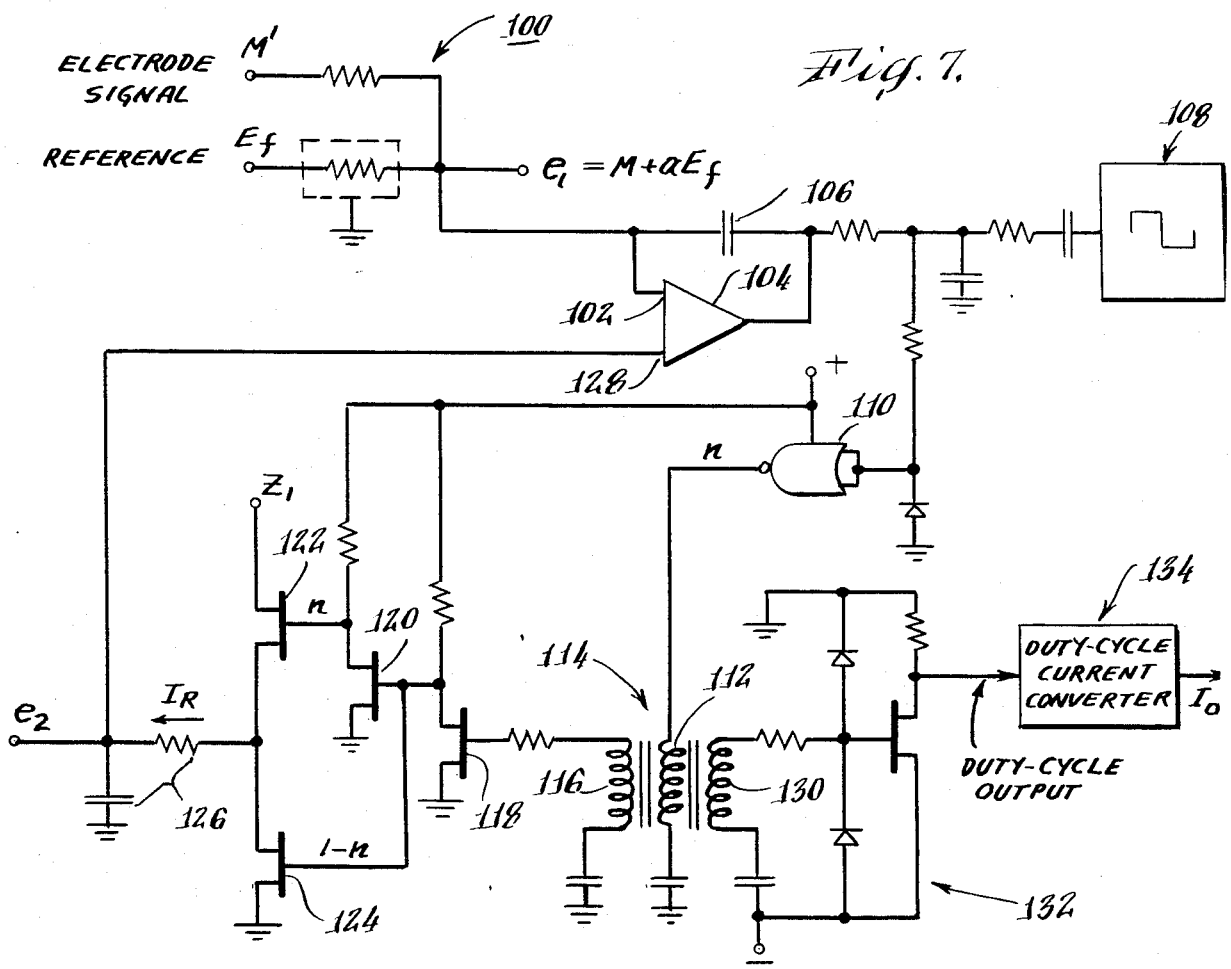
FIG. 7 is a block diagram showing apparatus for developing a pulsed duty-cycle signal representing the output of a DC magnetic flow meter.

The embodiment of FIG. 5 is particularly advantageous for use with a magnetic flowmeter because the pulsed output signal frequency "f" is proportional to flow rate, and therefore the output pulses can be used to drive a totalizer, giving a measure of the total quantity of fluid which has flowed through the meter over a selected period of time. FIG. 7 shows a different output signal circuit for use with a magnetic flowmeter, and providing a pulsed duty-cycle output signal which is conductively isolated from the flowmeter.

In the FIG. 7 embodiment, the flowmeter signal M' and the field-responsive voltage $E_f$ are connected together through a resistor network 100 to an input terminal 102 of an op amp 104 having an integrating capacitor 106. The amplifier input voltage designated el, is represented symbolically as $M+aE_f$, where M is the signal component corresponding to the flow signal M', and "a" is a factor determined by the design of the network 100. The output circuit of the amplifier 104, as in the FIG. 1 embodiment, receives a triangular-wave ramp-signal, derived from a squarewave generator 108. The ramp signal controls the firing of a comparator 110 in accordance with the d-c level of the amplifier output.

The comparator 110 produces duty-cycle pulses "n" which are directed to the primary winding 112 of a transformer generally indicated at 114. A secondary winding 116 delivers a corresponding pulse to a CMOS switch 118 driving three other CMOS switches 120,122,124. The latter two switches 122, 124 are in series, and are driven alternately to produce through an RC circuit 126 an averaged signal derived from the field-responsive voltage $E_f$. This averaged signal, designated $e_2$, is connected to the lower input terminal 128 of the amplifier 104.

As will be understood from the earlier descriptive material hereinabove, the proportionate length of the duty-cycle pulse "n" is controlled by negative feedback action so that it will have a value determined by the flow signal M and by the field-responsive voltage $E_f$.

More particularly, since the average current $I_R$ in the RC circuit 126 is zero, it can readily be shown that:

$$n(E_f - e_2) = (1-n)e_2$$

$$E_2 = nE_f = M + aE_f = e_2$$

thus $$n = (M/E_f) + a$$

The duty-cycle signal "n" is converted to an isolated current-format output signal, e.g. varying from 4 ma to 20 ma full scale. For this purpose, the transformer 114 includes another secondary winding 130, matching the secondary winding 116, and delivering the transformer pulse to an amplifier circuit generally indicated at 132. The pulse output of this circuit drives a duty-cycle-to-current converter 134, which may be of conventional construction arranged to produce the desired output current $I_o$. This output current preferably has a "live zero" (e.g. 4 ma), determined by the constant factor "a" designed into the network 100. Thus the feedback action of switches 122, 124 will produce a predetermined duty-cycle signal ($n_o$) for zero flow rate, and this signal no in turn produces the required "live-zero" output current.

Although several preferred embodiments of the invention have been disclosed herein in detail, it is to be understood that this is for the purpose of illustrating the invention, and should not be construed as necessarily limiting the scope of the invention, since it is apparent that many changes can be made by those skilled in the art while still practicing the invention claimed herein.

What is claimed:

1. In an industrial process instrumentation system wherein analog-format electrical signals are developed responsive to process conditions or the like, apparatus for transforming an analog-format signal into a corresponding pulsed signal comprising:

signal-translation means having an input circuit and an output circuit;

means for coupling an analog-format input signal to said signal-translation means;

a comparator coupled to the output circuit of said signal-translation means and responsive to the output signal in the output circuit;

ramp-generating circuit means for producing a periodic ramp signal;

said ramp-generating circuit means comprising capacitor means coupling the ramp signal to said output circuit, whereby the d-c signal level of said ramp signal in said output circuit is controlled by said output circuit signal;

said comparator thereby producing pulses having a duty-cycle controlled by said output circuit signal; and negative feedback means responsive to said pulses for producing an analog-format negative feedback signal having a magnitude corresponding to said duty-cycle and opposing said analog-format input signal to control said output circuit signal to provide that said duty-cyle corresponds to the magnitude of said analog-format input signal.

2. In an industrial process instrumentation system wherein analog-format electrical signals are developed resonsive to process conditions or the like, apparatus for transforming an analog-format signal into a corresponding pulsed signal comprising:

signal-translation means having an inupt circuit and an output circuit;

said signal-translation means comprising an amplifier having a feedback capacitor to produce integration;

means for coupling an analog-format input signal to said signal-translation means;

a comparator coupled to the output circuit of said signal-translation means and responsive to the output signal in the output circuit;

circuit means for producing repetitive firing of said comparator to develop pulses having an analog characteristic controlled by said output circuit signal;

second capacitor means;

a controllable voltage source;

negative feedback means coupled to the output of said comparator; and switch means in said negative feedback means and operable by said pulses produced by said comparator;

said switch means being operable by said pulses to connect said second capacitor means to said voltage source in a first part of an operating cycle, so as to charge up said second capacitor means, and in the second part of the cycle to connect said charges capacitor means to the input of said amplifier to alter the charge on said feedback capacitor means in accordance with the amount of charge placed on said second capacitor means by said controllable voltage source, whereby the output of said amplifier will be altered in a ramp-like manner in one direction in one part of the cycle and in the other direction in the other part of the cycle.

3. Apparatus as claimed in 2, including pulse-stretching means coupled to the output of said comparator to produce a pulse of fixed length when the comparator fires;

said fixed-length pulse serving to operate said switch means to connect said second capacitor means to said amplifier input and cause the amplifier output to vary away from the comparator firing threshold during the first part of the cycle;

the amplifier output thereafter ramping back towards the firing threshold to effect the next firing of the comparator during the second part of the cycle;

said varying of said amplifier output away from said threshold followed said ramping of said output signal back towards said threshold producing a periodic pulse output signal having a particular frequency.

4. Apparatus as claimed in claim 3, wherein the voltage of said voltage source represents a variable quantity, whereby said pulse output signal frequency produced by the apparatus reflects the input divided by said variable quantity.

5. In an industrial process instrumentation system wherein analog-format electrical signals are developed responsive to process conditions or the like, apparatus for transforming an analog-format signal into a corresponsponding pulsed signal representing the square-root of the value of said analog-format signal, comprising:

first signal-translation means having an input circuit and an output circuit; means for coupling an analog-format input signal to said signal-translation means;

a comparator coupled to the output circuit of said signal-translation means and responsive to the output signal in the output circuit;

circuit means coupled to said comparator for producing a periodic ramp-like signal causing periodic firing of said comparator and producing pulses having a duty-cycle controlled by said first signal translation means output circuit signal;

negative feedback means responsive to said pulses for producing a variable duty-cycle feedback signal;

means for converting said duty-cycle signal to an analog-format feedback signal coupled to the input circuit of said first signal translation means and opposing said analog-format input signal;

second signal-translation means arranged to receive said variable duty-cycle signal and to produce a corresponding analog signal level; and means forming part of said converting means and responsive to said analog signal level for controlling the magnitude of said analog-format feedback signal in accordance with said analog signal level from said second signal translation means, whereby said analog signal level is caused by feedback action to be proportional to the square root of said analog-format signal.

6. Apparatus as claimed in claim 5, wherein said converting means comprises a pair of alternately-operable switches having a common terminal connection coupled to said input circuit of said signal-translation means; and the remote terminals of said switches being connected to respective voltage points to deliver to said input circuit an analog-format negative feedback signal in accordance with the potentials of said voltage points and the duty-cycle of said alternately-operable switches.

7. Apparatus as claimed in claim 6, including a second pair of alternately-operable switches having a common terminal connection coupled to the input of said second signaltranslation means;

the remote terminals of said second pair of switches being connected to respective reference potentials.

8. Apparatus as claimed in claim 5, wherein said first signal translation means comprises an integrator.

9. In an industrial process instrumentation system wherein analog-format electrical signals are developed responsive to process conditions or the like, apparatus for transforming an analog-format signal into a corresponding pulsed duty-cycle signal comprising:

signal-translation means having an input circuit and an output circuit;

a pair of alternately-operable switches having a common terminal connection coupled to said input circuit;

the remote terminals of said switches being connected to respective voltage points to deliver an analog-format negative feedback signal to said input circuit in accordance with the potentials of said voltage points and the duty-cycle of said alternately-operabe switches;

a comparator coupled to the output circuit of said signal-translation means and responsive to the output signal in said output circuit;

circuit means coupled to said comparator for producing a periodic ramp-like signal causing periodic firing of said camparator and producing pulses having a duty-cycle controlled by said output circuit signal;

negative feedback means responsive to said pulses for producing a variable duty-cycle feedback signal; and means coupling said variable duty-cycle feedback signal to said alternately-operable switches to control the duty-cycle thereof and thereby to control said analog-format negative feedback signal appling said input circuit in opposition to said analog-format input signal, whereby said duty-cycle is made to correspond to the magnitude of said analog-format input signal.

10. Apparatus as claimed in claim 9, including an RC filter circuit to couple said analog-format negative feedback signal to the input of said signal-translation means; said signal-translation means comprising an integrator.

11. Apparatus for transforming an analog-format signal into a corresponding duty-cycle signal comprising:

signal-translation means having an input and an output;

means for coupling an analog-format input signal to said signal-translation means;

an up-and down ramp signal circuit coupled to the output of said signal-translation means with the d-c level of the ramp signal controlled by the output signal of said signal-translation means;

comparator means coupled to said ramp signal circuit for producing a pulsed duty-cycle signal corresponding to the times said ramp signal is of a predetermined polarity relative to the firing threshold of said comparator means;

circuit means for converting said duty-cycle signal to a corresponding averaged signal of analog format;

means coupling said averaged signal to the input of said signal translation means in opposition to said input signal;

said signal-translation means serving to set said d-c level in accordance with the difference between said averaged signal and said input signal, thereby controlling correspondingly said duty-cycle signal; and output means for producing an output signal corresponding to said duty cycle.

12. Apparatus as claimed in claim 11, wherein said signal-translation means comprises an amplifier.

13. Apparatus as claimed in claim 11, wherein said signal-translation means comprises an integrator.

14. Apparatus as claimed in claim 11, wherein said circuit means comprises a switch operated by said pulsed duty-cycle signal and connected between a reference voltage and the input of said signal-translation means.

15. Apparatus as claimed in claim 14, including a second switch operable alternately with said first switch and connecting the input of said signal translation means to a common terminal.

16. Apparatus as claimed in claim 15, wherein the input of said signal translation means comprises a series resistor and a shunt capacitor to develop the averaged signal from the operation of said switches.

17. Apparatus as claimed in claim 14, including a second switch operable in synchronism with said first switch so that both switches close for the same time duration and open for the same time duration;

a source of voltage coupled to an input terminal of said second switch; and a load connected to an output terminal of said second switch to receive current developed by said source voltage.

18. Apparatus as claimed in claim 17, wherein said load comprises a signal-generating circuit for developing an analog-format signal responsive to the average value of the pulsed duty-cycle signal.

19. Apparatus as claimed in claim 17, including a first resistor in the input of said signal-translation means and connected to said first switch to receive pulsed current developed by said reference voltage;

said load comprising a second resistor;

the magnitude of the effective resistance of said second resistor tracking the effective resistance of said first resistor as a result of the synchronized operation of said two switches.

20. Apparatus as claimed in claim 17, including a third switch operable alternately with said first switch and connecting the input of said signal-translation means to a reference potential during the switch on times; and a fourth switch operable alternately with said second switch and connecting said load to a reference potential during the switch on times.

21. Apparatus as claimed in claim 20, wherein said load comprises a signal-generating circuit for developing an analogformat signal responsive to the average value of the pulsed duty-cycle signal.

22. Apparatus as claimed in claim 21, wherein said signal-generating circuit comprises a low-pass filter circuit for developing an averaged signal; and an amplifier connected to said low-pass filter circuit to produce a corresponding output signal.

23. Apparatus as claimed in claim 11, including second signal-translation means;

second circuit means for converting said duty-cycle signal to a second corresponding averaged signal of analog format; and means coupling said second averaged signal as an input to said first circuit means to provide that said first corresponding averaged signal is proportional to the product of said duty-cycle signal and of said second averaged signal, whereby said second averaged signal is proportional to the square root of said first analog-format signal.

24. Apparatus as claimed in claim 23, wherein both said first and second circuit means comprise switch means controlled by the pulses of said duty-cycle signal.

25. Apparatus as claimed in claim 24, wherein both said first and second circuit means comprise reference signals connected to said switch means.

26. Apparatus as claimed in claim 25, wherein said reference signal for said second circuit means is fixed in magnitude;

said second averaged signal serving as the reference signal for said first circuit means.

27. Apparatus as claimed in claim 11, including a resistance network including a temperature-responsive resistor for developing said analog-format input signal.

28. Apparatus as claimed in claim 27, including a fixed reference voltage coupled to said network to produce said input signal.

29. Apparatus as claimed in claim 28, wherein said circuit means is responsive to said reference voltage to provide that changes in said averaged signal and said input signal due to changes in said reference voltage will tend to cancel.

30. Apparatus as claimed in claim 29, wherein said circuit means comprises a pair of switches operable alternately in response to said duty-cycle signal.

31. Apparatus as claimed in claim 11, wherein said circuit means comprises a single on-off switch operable in response to said dutycycle signal.

32. Apparatus as claimed in claim 31, including a current source coupled to the input of said signal-translation means to serve as said analog-format signal.

33. Apparatus as claimed in claim 32, including a reference voltage coupled to one terminal of said switch to develop current therethrough when the switch is on; and
- a resistor connected between the other switch terminal and an input terminal of said signal-translation means.

34. Apparatus as claimed in claim 33, wherein said signal-translation means comprises an amplifier with negative feedback means to maintain the input terminal at a reference potential.

35. Apparatus as claimed in claim 34, including a second switch operated in synchronism with said first switch;
- a second reference voltage connected to one terminal of said second switch; and
- a second resistor connected between the other second switch terminal and a reference potential;
- whereby the effective resistance of said second transistor will track the effective resistance of said first resistor.

36. Apparatus as claimed in claim 11, wherein said analog-format signal is a flow signal produced by a magnetic flowmeter;
- a reference voltage coupled to said circuit means to develop said averaged signal in accordance with the value of said reference voltage;
- said reference voltage varying in accordance with the field current of said magnetic flowmeter, and compensating said duty-cycle signal for changes in field current of said flow-meter.

37. Apparatus as claimed in claim 36, wherein said circuit means comprises switch means operable by the duty cycle signal pulses.

38. Apparatus as claimed in claim 37, including first transformer means coupling the pulse signal to said switch means
- a duty-cycle-to-current converter; and
- second transformer means coupling said duty-cycle signal to said converter to produce a current-format output signal.

39. Apparatus as claimed in claim 38, wherein said first and second transformer means are matched.

* * * * *